US012811569B2

(12) United States Patent
Shrivastava et al.

(10) Patent No.: US 12,811,569 B2
(45) Date of Patent: Nov. 24, 2026

(54) GLITCH REDUCTION IN PHASE SHIFTERS

(71) Applicant: pSemi Corporation, San Diego, CA (US)

(72) Inventors: Ravindranath D. Shrivastava, San Diego, CA (US); Fleming Lam, San Diego, CA (US); Payman Shanjani, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 19/111,470

(22) PCT Filed: Aug. 29, 2023

(86) PCT No.: PCT/US2023/031365

§ 371 (c)(1),
(2) Date: Mar. 13, 2025

(87) PCT Pub. No.: WO2024/063927

PCT Pub. Date: Mar. 28, 2024

(65) Prior Publication Data

US 2026/0221958 A1 Jul. 30, 2026

Related U.S. Application Data

(63) Continuation of application No. 17/933,230, filed on Sep. 19, 2022, now Pat. No. 12,101,072.

(51) Int. Cl.
*H03H 11/24* (2006.01)
*H03H 7/20* (2006.01)

(52) U.S. Cl.
CPC ............ *H03H 11/245* (2013.01); *H03H 7/20* (2013.01)

(58) Field of Classification Search
None
See application file for complete search history.

(56) References Cited

U.S. PATENT DOCUMENTS

| | | | | |
|---|---|---|---|---|
| 5,440,280 | A | 8/1995 | Lord | |
| 6,741,207 | B1 | 5/2004 | Allison et al. | |
| 9,397,635 | B2 | 7/2016 | Costa | |
| 9,602,091 | B1 * | 3/2017 | Sharma | H01P 1/227 |
| 9,935,614 | B2 | 4/2018 | Shrivastava | |
| 10,193,531 | B2 | 1/2019 | Shrivastava | |
| 10,340,892 | B2 | 7/2019 | Bacon et al. | |
| 10,693,435 | B2 * | 6/2020 | Shapiro | H03H 7/20 |

(Continued)

OTHER PUBLICATIONS

International Search Report and Written Opinion issued for International Application No. PCT/US2023/031365 filed on Aug. 29, 2023 on behalf of Psemi Corporation. Mail Date: Dec. 12, 2023. 10 pages.

*Primary Examiner* — Cassandra F Cox
(74) *Attorney, Agent, or Firm* — Steinfl + Bruno LLP

(57) ABSTRACT

Methods and devices to reduce glitches in phase shifters implementing high isolation switches are disclosed. Such glitches occur at the output of the phase shifters when transitioning from one phase shift to another. The disclosed method implements delays in various steps of the phase shifter transitions. Exemplary embodiments implementing single-pole multi-throw are provided and exemplary performance of the disclosed methods are also presented. The described methods are also applicable to multi-step attenuators.

20 Claims, 20 Drawing Sheets

(56) References Cited

U.S. PATENT DOCUMENTS

| | | | |
|---|---|---|---|
| 12,101,072 | B2 | 9/2024 | Shrivastava et al. |
| 2008/0180189 | A1 | 7/2008 | Miya |
| 2011/0304409 | A1 | 12/2011 | Tamura |
| 2015/0358015 | A1 | 12/2015 | Bawell et al. |
| 2016/0034430 | A1 | 2/2016 | Beavers et al. |
| 2017/0230028 | A1 | 8/2017 | Gamal El Din et al. |
| 2021/0021257 | A1 | 1/2021 | Shrivastava et al. |
| 2022/0263231 | A1 | 8/2022 | Brobston |
| 2024/0097656 | A1 | 3/2024 | Shrivastava et al. |

* cited by examiner

100B

100C

200

200

200

200

300

300

500

500

500

600

700

GLITCH REDUCTION IN PHASE SHIFTERS

CROSS-REFERENCE TO RELATED APPLICATIONS

The present application is the U.S. National Stage of International Patent Application No. PCT/US2023/031365, filed on Aug. 29, 2023, which in turn, claims priority to and is a continuation of U.S. patent application Ser. No. 17/933,230, filed on Sep. 19, 2022, which issued as U.S. Pat. No. 12,101,072 on Sep. 24, 2024, the contents of which are incorporated herein by reference in their entirety.

TECHNICAL FIELD

The present disclosure is related to phase shifters, more in particular to methods and devices to reduce glitches in phase shifters implementing high isolation switches, when such phase shifters transition from one phase shift to another.

BACKGROUND

Phase shifters may be implemented using high isolation switches. FIG. 1A shows a prior art phase shifter (100A) including single-pole 4-throw (SP4T) switches (SW1, SW2) having throw terminals (1, . . . , 4) and (1', . . . , 4') respectively. The two switches are connected to each other through paths (101, . . . , 104). Each path has different phase shifts, and by switching selectively from one path to another, the phase shift between input terminal (IN) and output terminal (OUT) can be changed. Control voltages (V11, V12) and (V21, V22) control the states of switches (SW1, SW2) respectively to determine which path will connect input terminal (IN) to output terminal (OUT). Generally, the phase shifter paths (101, . . . , 104) may be implemented using transmission lines or LC circuits (i.e. inductors and capacitors) or any other method to generate the desired unique phase shifts on each path. The phase shifter shown can be similarly implemented using switches with any number of throws (e.g. SP2T, SP8T, etc.)

The phase shifters as described above often exhibit glitching issues when switching from one path to another. The glitch results in an undesired and abrupt amplitude, frequency and phase change at the output of the phase shifters, preventing the user from transmitting data. FIG. 1B shows graph (100B) demonstrating the glitch issue as described above. Curve (105) represents an example of the variations of the signal amplitude at output terminal (OUT) of FIG. 1A vs. time. In this example, the transition from one phase shift to another is triggered at time instant (T1), and the undesired amplitude glitch occurs between time instants (T1) and (T4).

FIG. 1C shows a prior art phase shifter (100C) implementing a first set of switches (110) and a second set of switches (120). Phase shifter (100C) includes paths (P1, P2), each selectively coupling input terminal (IN) to output terminal (OUT). Each set of switches shown comprises series and shunt switches. For example, the first set of switches (110) includes series switches (S11, S21) and shunt switches (S12, S22). Similarly, the second offset of switches (120) includes series switches (S13, S23) and shunt switches (S14, S24). The above-mentioned shunt switches are implemented for further isolation. In correspondence with the desired phase shift, either of paths (P1, P2) can be selected by controlling the state of series and shunt switches within the sets of switches (110, 120). In the example shown in FIG. 1C, path (P1) is active, and path (P2) is inactive. In other words, series switches (S11, S13) are ON (closed) and series switches (S21, S23) are OFF (open). Moreover, and for further isolation, shunt switches (S12, S14) are OFF (open), and shunt switches (S22, S24) are ON (closed).

In what follows, more details on the underlying root cause of the phase shifter glitch as described previously will be provided. For the sake of explanation, phase shifters with the same structure as that of phase shifter (100C) of FIG. 1C will be considered, although the issue is the same in the phase shifters implementing switches with any number of throws.

FIGS. 2A-2C show a first example of prior art steps to transition phase shifter (200) from one phase shift to another, e.g. switching from path (Pl) to path (P2). During a first step (FIG. 2A), path (P1) is active, and path (P2) is inactive. In other words, switches (S11, S13, S22, S24) are ON (closed) and switches (S12, S14, S21, S23) are OFF (open). During a second step (FIG. 2B), series switches (S11, S13) are turned OFF, shunt switches (S12, S14) are turned ON, and shunt switches (S22, S24) are turned OFF. During a third step (FIG. 2C), switches (S21, S23) are turned ON. Path (P2) is active, and Path (P1) is inactive in the third step and the transition has now taken place. As can be seen in FIG. 2B, during the second step, both paths (P1, P2) are inactive and the input and output terminals (IN, OUT) are decoupled, resulting in a glitch at the output terminal (OUT) during the third step. The reason for the glitch issue in this first example is that the series switches in the second path (P2) are turned ON after the series switches in path (P1) are turned OFF.

FIGS. 2D-2F show a second example of prior art steps to transition phase shifter (200) from one phase shift to another, e.g. switching from path (P1) to path (P2). During a first step (FIG. 2D), path (P1) is active, and path (P2) is inactive. In other words, switches (S11, S13, S22, S24) are ON (closed) and switches (S12, S14, S21, S23) are OFF (open). During a second step (FIG. 2E), shunt switches (S12, S14) are turned ON. During a third step (FIG. 2F), series switches (S11, S13) are turn OFF, series switches (S21, S23) are turned ON, and shunt switches (S22, S24) are turned OFF. As shown in FIG. 2E, during the second step, path (P1) is shorted to ground, resulting in a glitch at output terminal (OUT) during such step. The reason for this glitch is that in this example, shunt switches (S12, S14) are turned ON faster than series switches (S11, S13) are turned OFF, causing a short to ground of path (P1).

FIGS. 2G-2J show a third example of prior art steps to transition phase shifter (200) from one phase shift to another, e.g. switching from path (P1) to path (P2). During a first step (FIG. 2G), path (P1) is active, and path (P2) is inactive. In other words, switches (S11, S13, S22, S24) are ON (closed) and switches (S12, S14, S21, S23) are OFF (open). During a second step (FIG. 2H), shunt switches (S12, S14) are turned ON. During a third step (FIG. 2I), series switches (S11, S13) and shunt switches (S22, S24) are turned OFF. During a fourth step (FIG. 2J), series switches (S21, S23) are turned ON. In this step path (P1) is inactive and path (P2) is active and the transition from path (P1) to path (P2) has occurred. As shown in FIG. 2H, during the second step, path (P1) is shorted to ground, and this a first cause for a glitch at the output terminal (OUT). Moreover, during the third step, both paths (P1, P2) are inactive, and as a result, terminals (IN, OUT) are decoupled. This is a second cause for the glitch at output terminal (OUT). Similarly, as in the second example described above, the reason for the short to ground path in the second step is that shunt switches (S12, S14) are turned ON faster than series switches (S11, S13) are turned OFF. Moreover, similarly to the first example, the decoupling of the input and output terminals (IN, OUT) during the second step is due to the fact that the series switches in the second path (P2) are turned ON at a slower pace than the series switches in path (P1) are turned OFF.

In view of the above, there is a need for methods and devices to overcome the above-described glitch issues in phase shifters implementing high isolation switches.

SUMMARY

The disclosed methods and devices address the glitch issues as described above.

According to a first aspect of the present disclosure, a phase shifter is provided, comprising: a first terminal and a second terminal; a first and a second phase shifting element; a control circuit; wherein the control circuit is configured to: in a first step: couple a first end of the first phase shifting element to the first terminal and couple a second end of the first phase shifting element to the second terminal; decouple the first and the second end of the first phase shifting element from the ground; decouple a first end of the second phase shifting element from the first terminal and a second end of the second phase shifting element from the second terminal; couple the first end and the second end of the phase shifting element to the ground; in a second step: decouple the first and the second end of the second phase shifting element from the ground; in a third step delayed by a duration of a first delay: couple the first end of the second phase shifting element to the first terminal and the second end of the second phase shifting element to the second terminal; in a fourth step delayed by a duration of a second delay: decouple the first end of the first phase shifting element from the first terminal and the second end of the first phase shifting element from the second terminal, and in a fifth step delayed by a duration of a third delay: couple the first and the second end of the first phase shifting element to the ground.

According to a second aspect of the present disclosure, an attenuator is provided, comprising: a first terminal and a second terminal; a first and a second attenuating element; a control circuit; wherein the control circuit is configured to: in a first step: couple a first end of the first attenuating element to the first terminal and couple a second end of the first phase attenuating to the second terminal; decouple the first and the second end of the first attenuating element from the ground; decouple a first end of the second attenuating element from the first terminal and a second end of the second attenuating element from the second terminal; couple the first end and the second end of the attenuating element to the ground; in a second step: decouple the first and the second end of the second attenuating element from the ground; in a third step delayed by a duration of a first delay: couple the first end of the second attenuating element to the first terminal and the second end of the second attenuating element to the second terminal; in a fourth step delayed by a duration of a second delay: decouple the first end of the first attenuating element from the first terminal and the second end of the first phase attenuating from the second terminal, and in a fifth step delay by a duration of a third delay: couple the first and the second end of the first attenuating element to the ground.

According to a third aspect of the present disclosure, a method of reducing a glitch at an output terminal of a phase shifter when transitioning from a first phase shift to a second phase shift is disclosed, the phase shifter comprising: a first terminal and a second terminal; a first and a second phase shifting element; a control circuit; the method comprising: in a first step: coupling a first end of the first phase shifting element to the first terminal and coupling a second end of the first phase shifting element to the second terminal; decoupling the first and the second end of the first phase shifting element from the ground; decoupling a first end of the second phase shifting element from the first terminal and a second end of the second phase shifting element from the second terminal; coupling the first end and the second end of the phase shifting element to the ground; in a second step: decoupling the first and the second end of the second phase shifting element from the ground; in a third step delayed by a duration of a first delay: coupling the first end of the second phase shifting element to the first terminal and the second end of the second phase shifting element to the second terminal; in a fourth step delayed by a duration of a second delay: decoupling the first end of the first phase shifting element from the first terminal and the second end of the first phase shifting element from the second terminal, and in a fifth step delayed by a duration of a third delay: coupling the first and the second end of the first phase shifting element to the ground.

According to a fourth aspect of the present disclosure, a method of transitioning from one phase shift to another phase shift in a phase shifter comprising: a first terminal and a second terminal; a control circuit; N selectively switchable phase shifting elements, each phase shifting element: coupling the input terminal to the output terminal when switched in, and being decoupled from the first terminal and the second terminal when switched out; the method comprising: proceeding, starting in a first step wherein an i-th phase shift element is switched in, and a rest of the phase shifting elements are switched out, switching out the i-th phase shifting element and switching in an (i+1)-th phase shifting element in a recursive manner, with the (i+1)-th phase shifting element acting as a switched-in phase shifting element for a next iteration until a j-th shifting element is switched in, and wherein: i is one integer selected from 1, 2, . . . , N−2, and j is one integer selected from i+2, . . . , N; a combination of the switching out the i-th phase shifting element and the switching in the (i+1)-th phase shifting element comprises: in a second step: decoupling a first and a second end of the (i+1)-th phase shifting element from the ground; in a third step, the third step being delayed by a duration of a first delay: coupling the first end of the (i+1)-th phase shifting element to the first terminal and the second end of the (i+1)-th phase shifting element to the second terminal; in a fourth step, the fourth step being delayed by a duration of a second delay: decoupling the first end of the i-th phase shifting element from the first terminal and the second end of the i-th phase shifting element from the second terminal, and in a fifth step, the fifth step being delayed by a duration of a third delay: coupling the first and the second end of the i-th phase shifting element to the ground.

Further aspects of the disclosure are provided in the description, drawings and claims of the present application.

DESCRIPTION OF THE DRAWINGS

Like reference numbers and designations in the various drawings indicate like elements.

DETAILED DESCRIPTION

According to the teachings of the disclosure, various time delays may be implemented at different steps of the transition of phase shifters from one phase shift to another. As will be described through exemplary embodiments, such implementation of time delays will help overcome the glitch issue as described previously.

FIGS. 3A-3E show exemplary steps to transition phase shifter (300) from one phase shift to another according to an embodiment of the present disclosure. Such transition takes place when phase shifter (300) switches from path (P1) to path (P2). Phase shifter (300) is the same as phase shifter (100C) of FIG. 1C. During a first step (FIG. 3A), path (P1) is active while path (P2) is inactive. In a second step (FIG. 3B) shunt switches (S22, S24) are turned OFF. During a third step (FIG. 3C), performed after the second step, series switches (S21, S23) are turned ON. After the third step, and during a fourth step (FIG. 3D), series switches (S11, S13) are turned OFF. During a fifth step, after the fourth step, shunt switches (S12, S14) are turned ON. After this step, the transition is complete. In other words, the transition process starts first with the path that is inactive where the shunt switch or switches is/are turned OFF first, and this is followed by turning ON the series switch or switches. Then, in the initially active path, the series switches are turned OFF, and this is followed by turning the shunt switch or switches of the initially active path ON. By virtue of implementing a proper sequence of controlling the state of the various switches through the introduction of activation/deactivation delays, the previously described issues such as shorting the active path to ground or having both paths inactive simultaneously can be reduced. This will result in a substantial decrease in the glitch at the output terminal. According to an embodiment of the present disclosure, switches (S11, S12) may be part of a first single-pole N-throw (SPNT), switches (S13, S14) may be part of a second SPNT, switches (S21, S22) may be part of a third SPNT, and switches (S23, S24) may be part of a fourth SPNT.

With reference to FIGS. 3A-3E, according to an embodiment of the present disclosure, assuming that the second step is performed at time zero, steps three, four and five are delayed by respective time delays $\Delta T_1<\Delta T_2<\Delta T_3$. One exemplary numerical profile for such delayed sequence $\Delta T_1/\Delta T_2/\Delta T_3$ is 200 ns/300 ns/650 ns, or 100 ns/200 ns/550 ns. Generally, delay durations can change depending upon the sizes of the switches and the charging/discharging time constant of the gate terminal of the devices implemented as series or shunt switches. In other words, the delay sequence depends on how fast the series and shunt switches perform their switching.

Figure 3B:
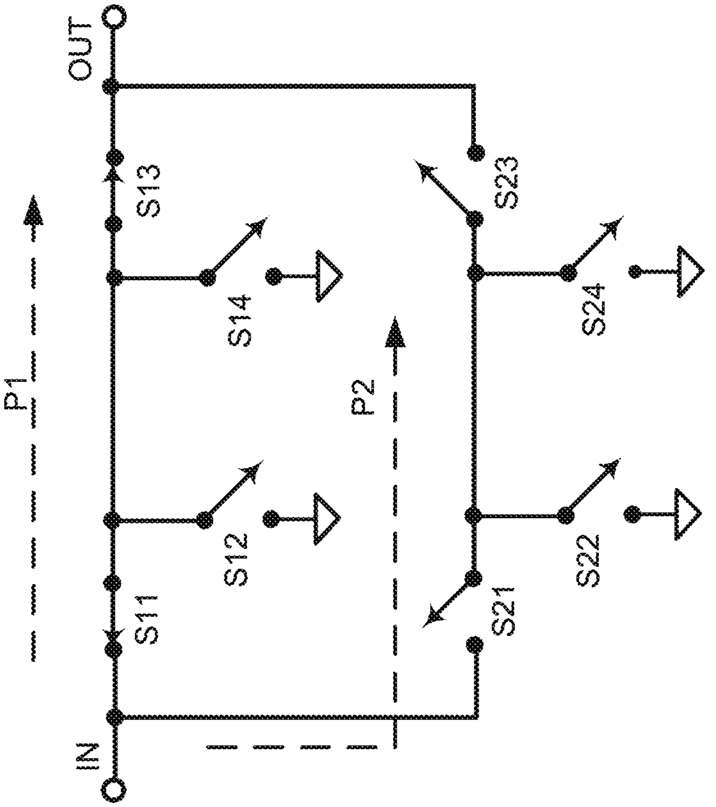
FIGS. 3A-3E show exemplary steps to transition a phase shifter from one phase shift to another according to an embodiment of the present disclosure.
Figure 3A:
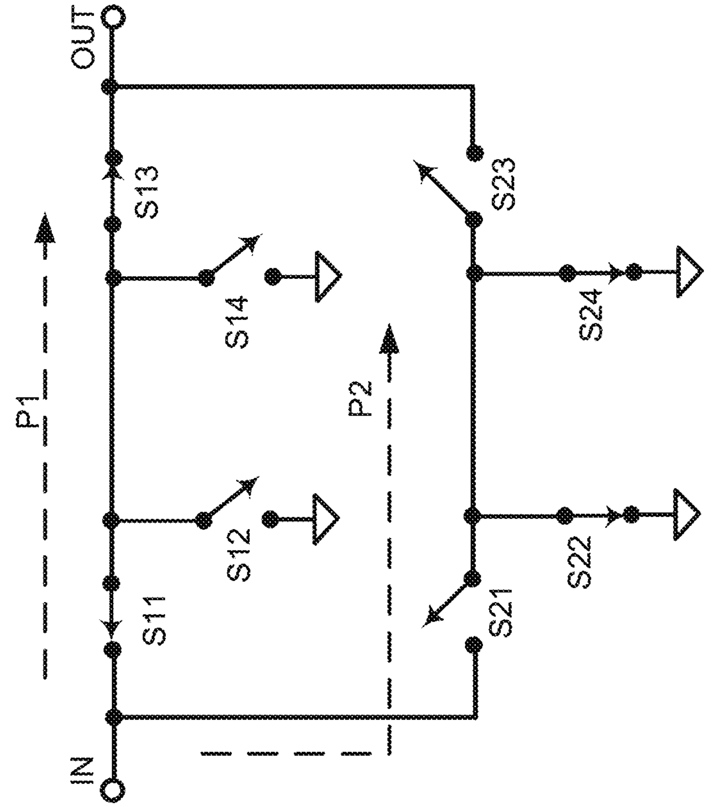
Figure 3D:
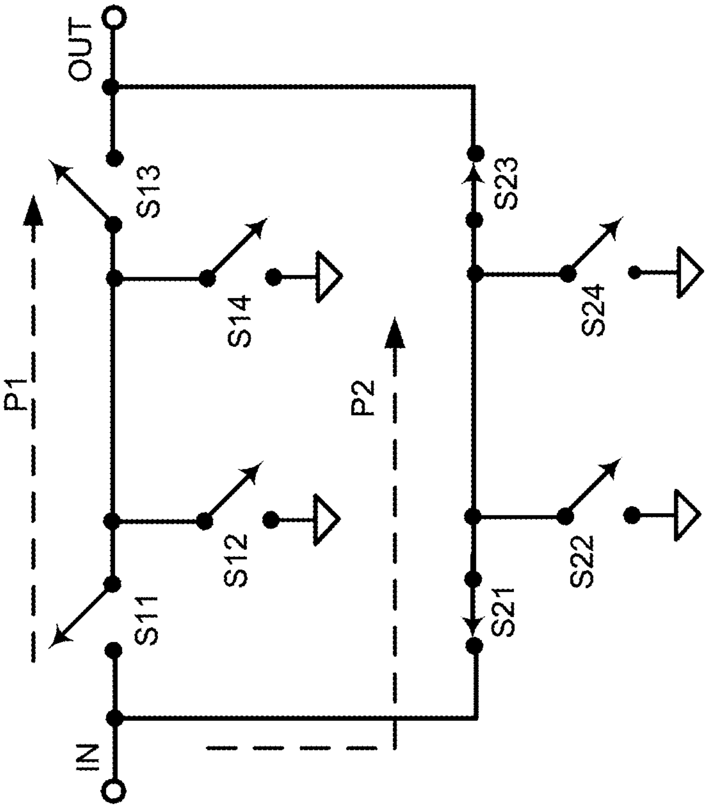
Figure 3C:
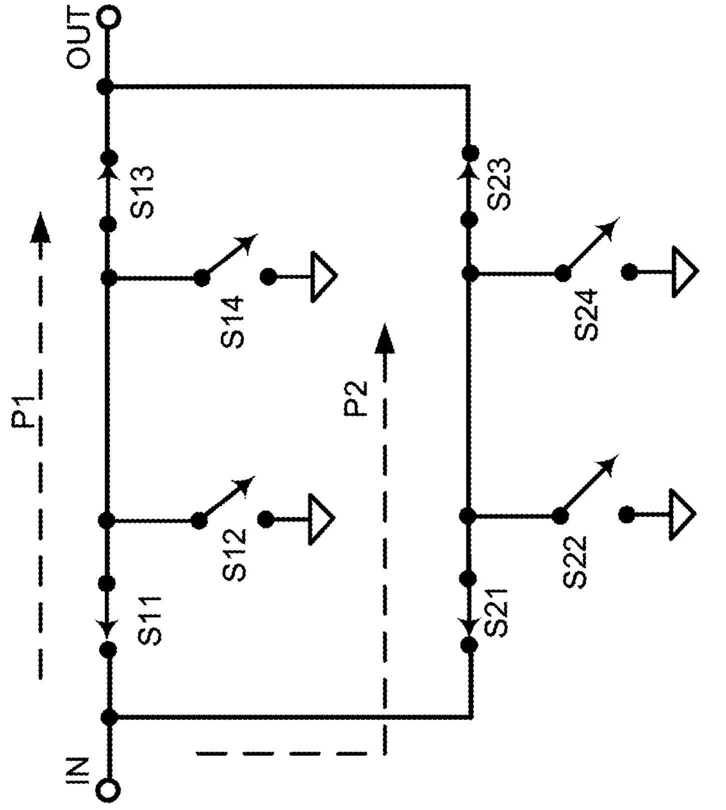
Figure 3E:
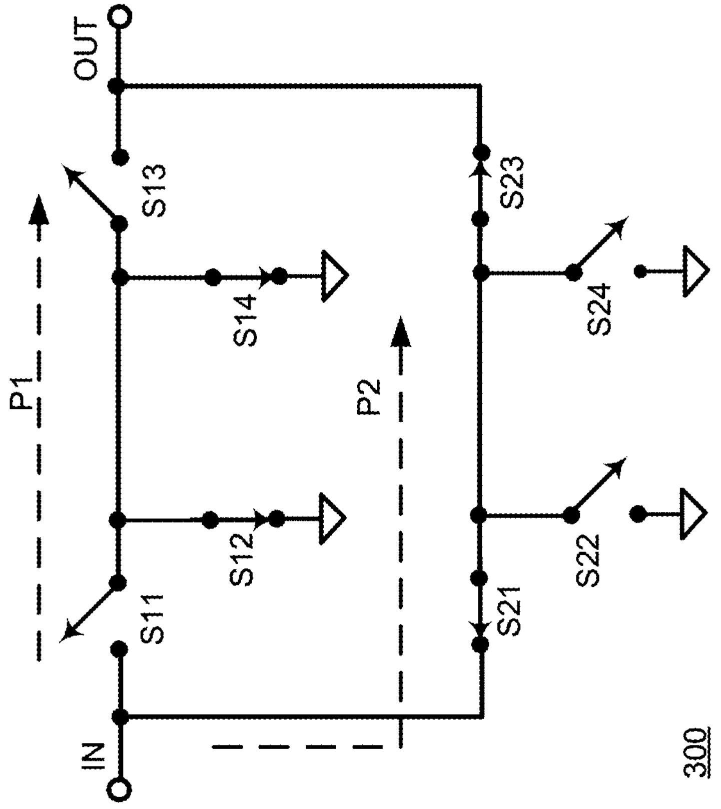
Figure 3G:
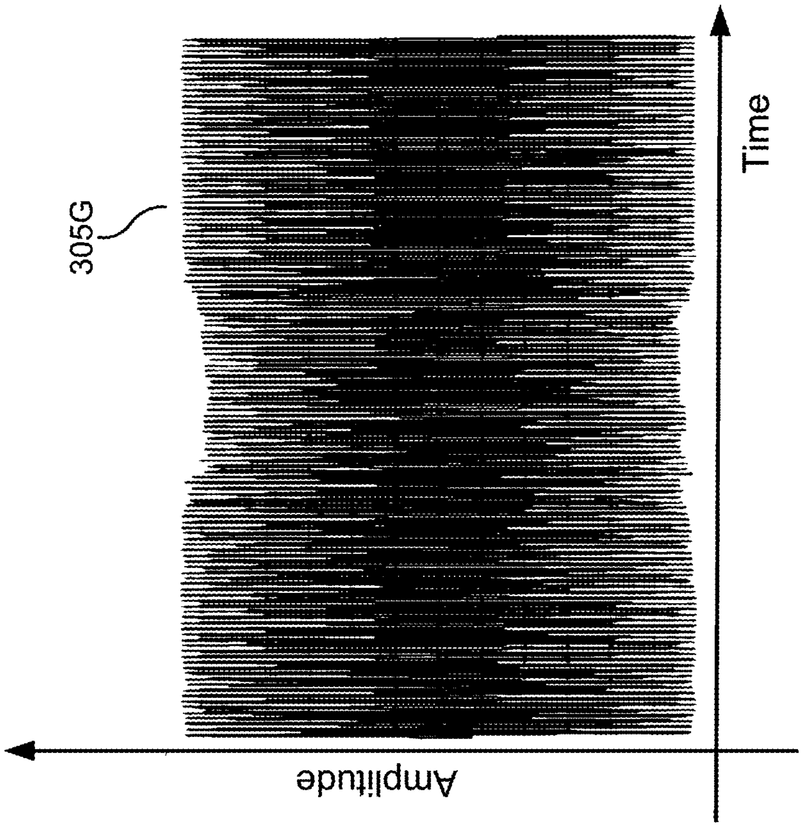
FIGS. 3F-3G represent an exemplary performance of a phase shifter transition from one phase shift to another according to an embodiment of the present disclosure.
Figure 3F:
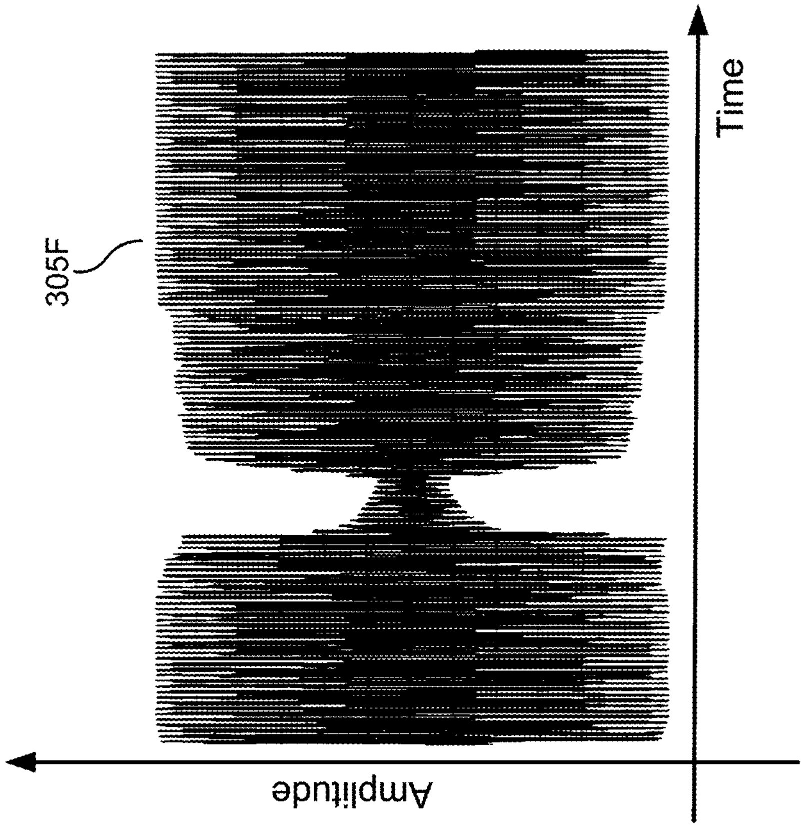

FIGS. 3F-3G represent the performance of the phase shifter transition method as disclosed above. FIG. 3F shows curve (305F) representing the glitch amplitude variation at the output terminal when the phase shifter is transitioning from one phase shift to another vs. time, and before applying the teachings of the present disclosure. FIG. 3G shows the same result, i.e. curve (305G), applying the above-disclosed method. A substantial reduction of the glitch amplitude can be noticed from such curve.

Figure 4:
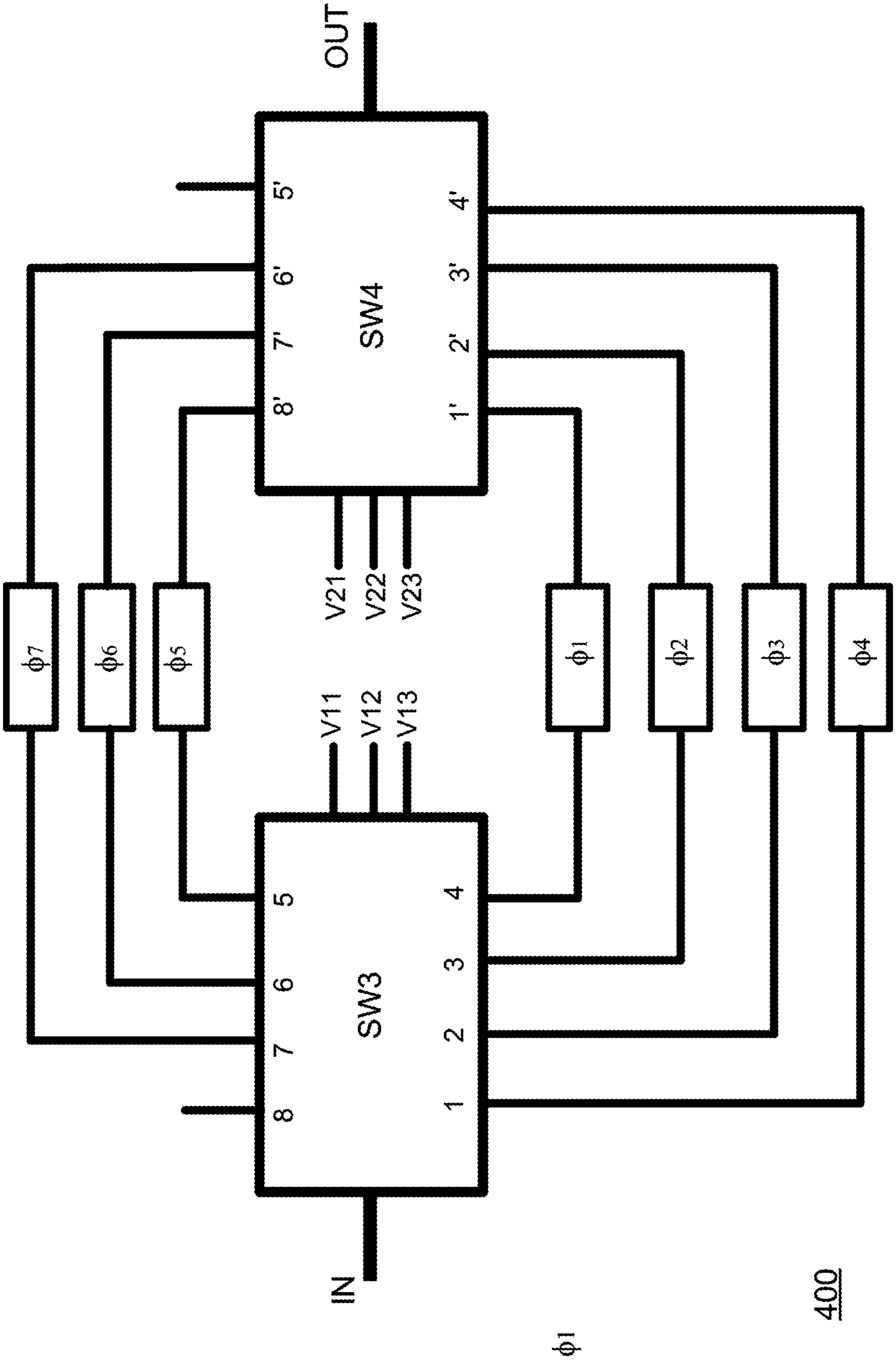
FIG. 4 shows a prior art phase shifter with multiple phase shifting paths.

With reference to previously discussed FIG. 3C, it is noticed that both paths (P1, P2) are active at the same time and for the duration of the third step of the phase shifter transitioning. The phase shifts of such paths are generally different or, in a worst case scenario, 180° apart. This may cause the issue of partial or full cancelation of the signal at the output terminal (OUT). In accordance with the teachings of the present disclosure, in order to overcome such issue, the transition between one phase shift to another may be implemented in a step-wise fashion rather than directly. In order to clarify this, reference is made to FIG. 4 showing phase shifter (400) including switches (SW3, SW4). The terminals of such switches are connected to one another through several paths having unique phase shifts ($\varphi_1, \ldots, \varphi_7$) arranged in increasing order. Each path from input terminal (IN) to each terminal of switches (SW3, SW4) includes a series and a shunt switch arranged similarly to the arrangement of series switch (S11) and shunt switch (S12) of, for example, FIG. 1C or FIGS. 2A-2E. Control voltages (V11, V12, V13) control the status of internal series and shunt switches of switch (SW3) and control voltages (V21, V22, V23) control the status of internal series and shunt switches of switch (SW4). With further reference to FIG. 3C, exemplary numerical values for phase shifts ($\varphi_1/\ldots/\varphi_7$ can be 0/30/60/90/120/150/180 degrees. In order, for example, to switch from the path with phase shift (F1), e.g. 0°, to the path with phase shift (F7), e.g. 180°, the transition may be performed incrementally in phase shifts, following the sequence $\varphi_1, \varphi_2, \ldots, \varphi_7$. In other words, the transition occurs recursively where in each iteration, the current active path will be deactivated and the following path with higher phase shift will be activated. The advantage of such method is that, during any given intermediary transition, as the phase shift increment is smaller, the signal cancelation issue is substantially reduced. In this approach, the overall transition time may increase due to higher number of phase shift transitions. In other embodiments, with reference to FIGS. 3A-3E, the signal cancelation issue at the output terminal may be mitigated by careful selection of the delays ($\Delta T_1$, $\Delta T_2$, $\Delta T_3$) to minimize the duration of the time when signal cancelation may occur. The phase shifter (400) of FIG. 4 implements switches with eight terminals. Other embodiments implementing switches with N terminals, with N being any integer greater than 3, and using the same methodology as described above may also be envisaged.

Figure 5B:
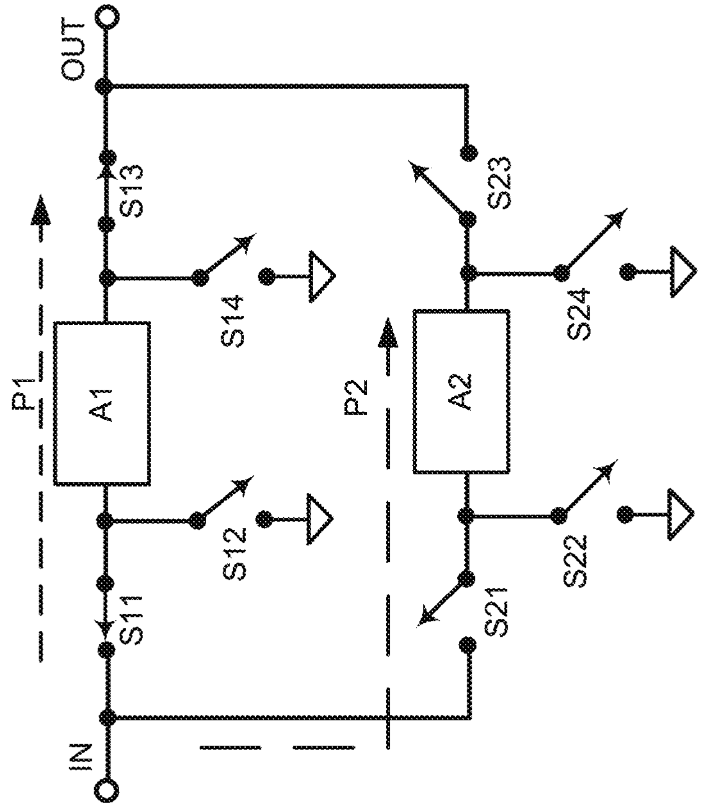
FIGS. 5A-5E show exemplary steps to transition a multi-step attenuator from one attenuation to another according to an embodiment of the present disclosure.
Figure 5A:
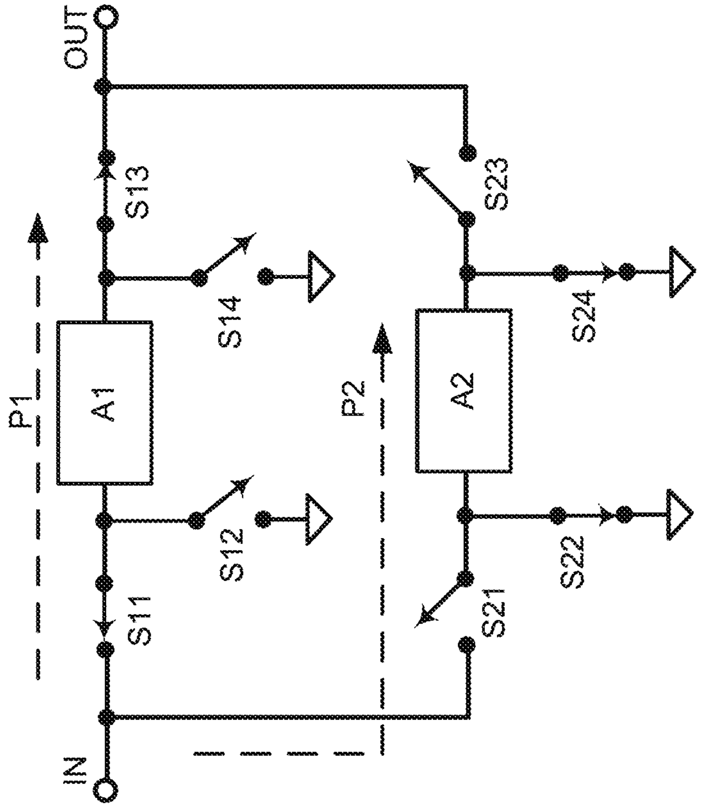
Figure 5D:
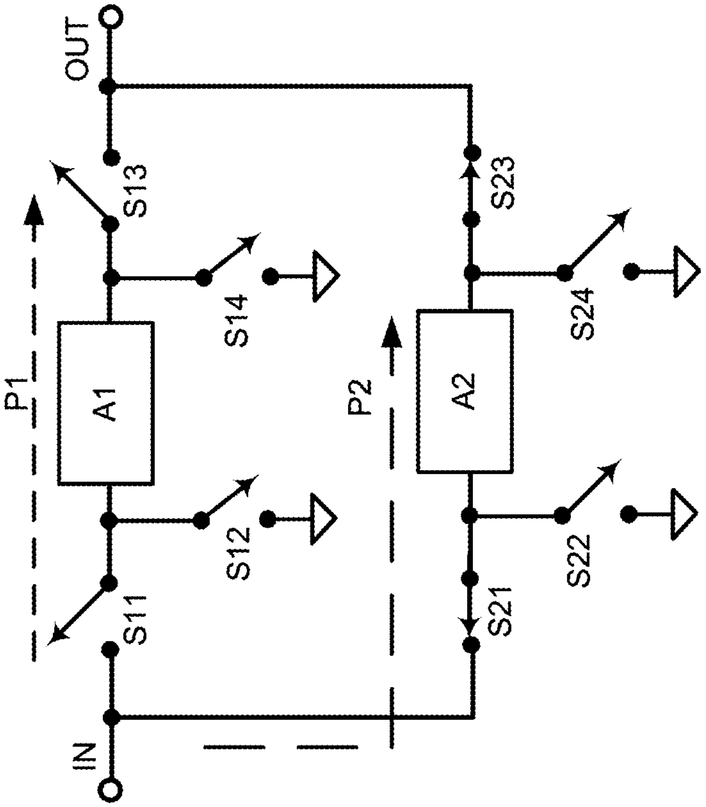
Figure 5C:
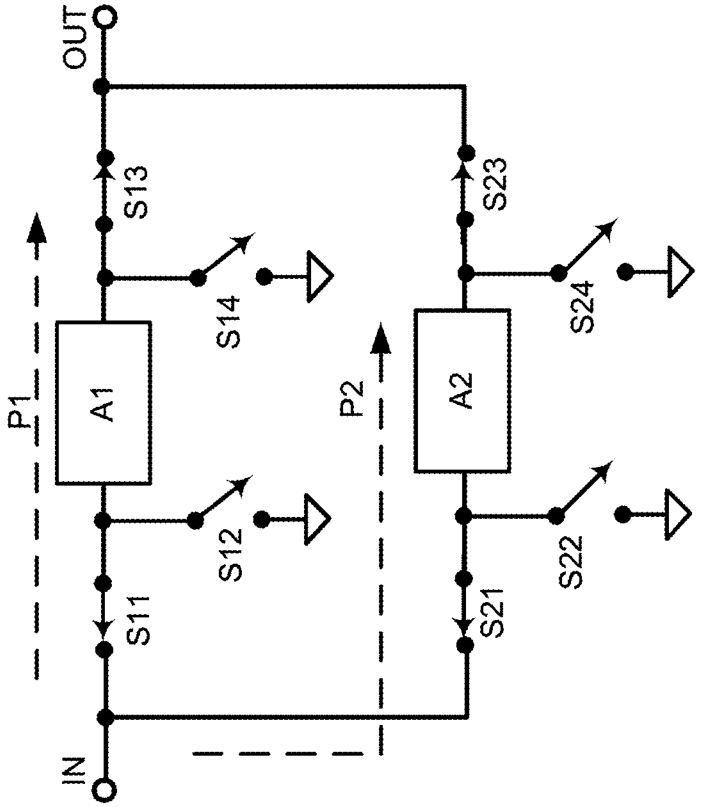
Figure 5E:
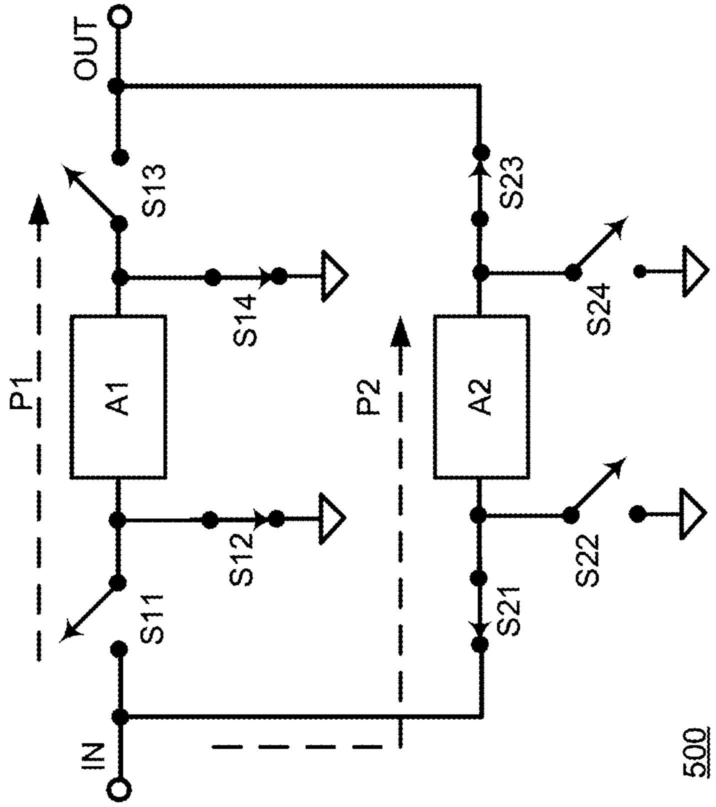

The disclosed methods can also be applied to multi-step attenuators implementing high isolation switches. FIG. 5A shows a prior art multi-step attenuator (500) implemented using SPDTs and including a first path (P1) having attenuator (A1) and a second path (P2) having attenuator (A2). The principle of operation of multi-step (500) is similar to what was described with regards to, for example, phase shifter (100C) of FIG. 1C, except this time, instead of transitioning between different phase shifts, the transitioning take place between different attenuations. In a similar way as described with regards to FIGS. 2A-2J, when transitioning from one attenuation to another in multi-step attenuator (500) of FIG. 5A, the same glitch issues may occur due to the same reasons previously described. As such, the transition steps disclosed with regards to embodiments of FIGS. 3A-3E may also be applied to multi-step attenuator (500). This is shown sequentially in FIGS. 5B-5E.

In some applications, the described phase shifters and multi-step attenuators may not have the need to implement shunt switches as part of the design of the high isolation switches. As an example, in a multi-step attenuator using large attenuations in each path, further isolation provided by the shunt switches may not be needed. FIG. 6A shows a prior art multi-step attenuator (600) that has similar architecture as the multi-step (500) of FIG. 5A except that shunt switches are not implemented as part of multi-step attenuator (600).

With reference to FIG. 6A, when transitioning from path (P1) to path (P2), similarly to what was described with regards to FIG. 2B, the same glitch issue at the output terminal may occur during a transitional period when both path paths (P1, P2) are inactive, in other words switches (S11, S13, S21, S23) are OFF at the same time during such transitional period.

Figure 6B:
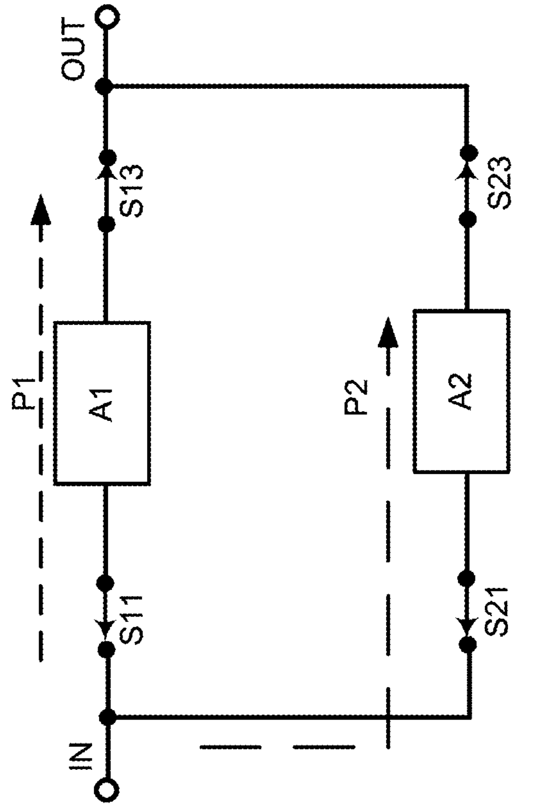
FIGS. 6A-6C show exemplary steps to transition a multi-step attenuator from one attenuation to another according to another embodiment of the present disclosure.
Figure 6A:
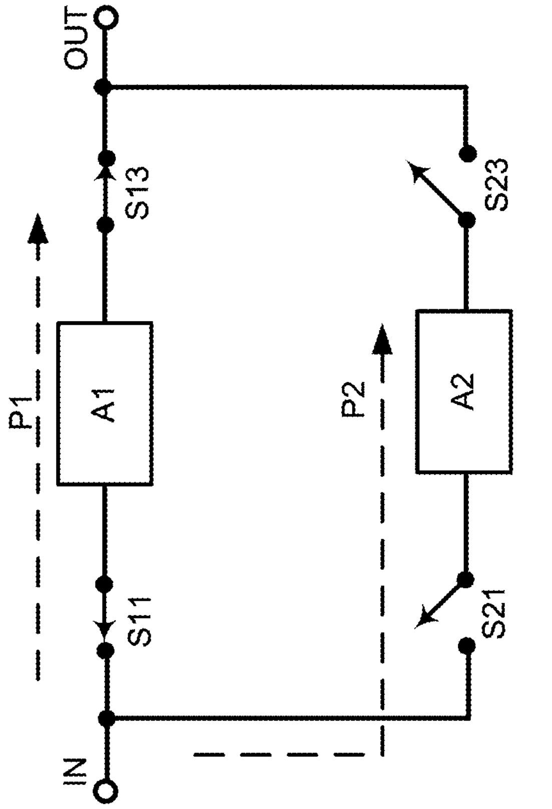
Figure 6C:
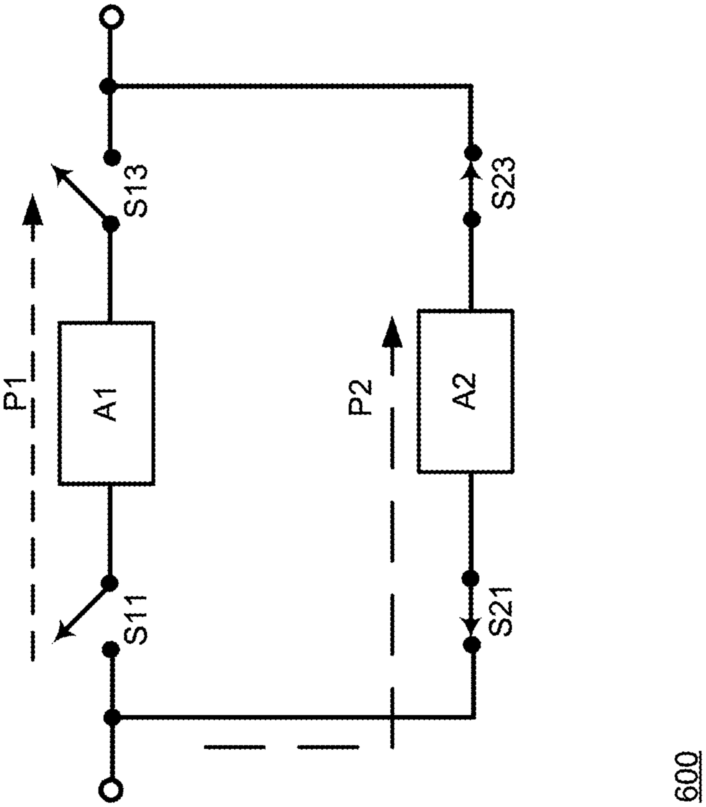

FIGS. 6A-6C show exemplary steps to transition multi-step attenuator (600) from one attenuation (e.g. path (P1)) to another (e.g. path (P2)), in accordance with an embodiment of the present disclosure. In a first step (FIG. 6A), path (P1) is active, and path (P2) is inactive. During a second step (FIG. 6B) series switches (S21, S23) are turned ON. This is followed by a third step (FIG. 6C) during which series switches (S11, S13) are turned OFF. At this point, the transition has taken place and path (P2) is coupling the input and output terminals (IN, OUT) while path (P1) is decoupled from such terminals.

Figure 1A:
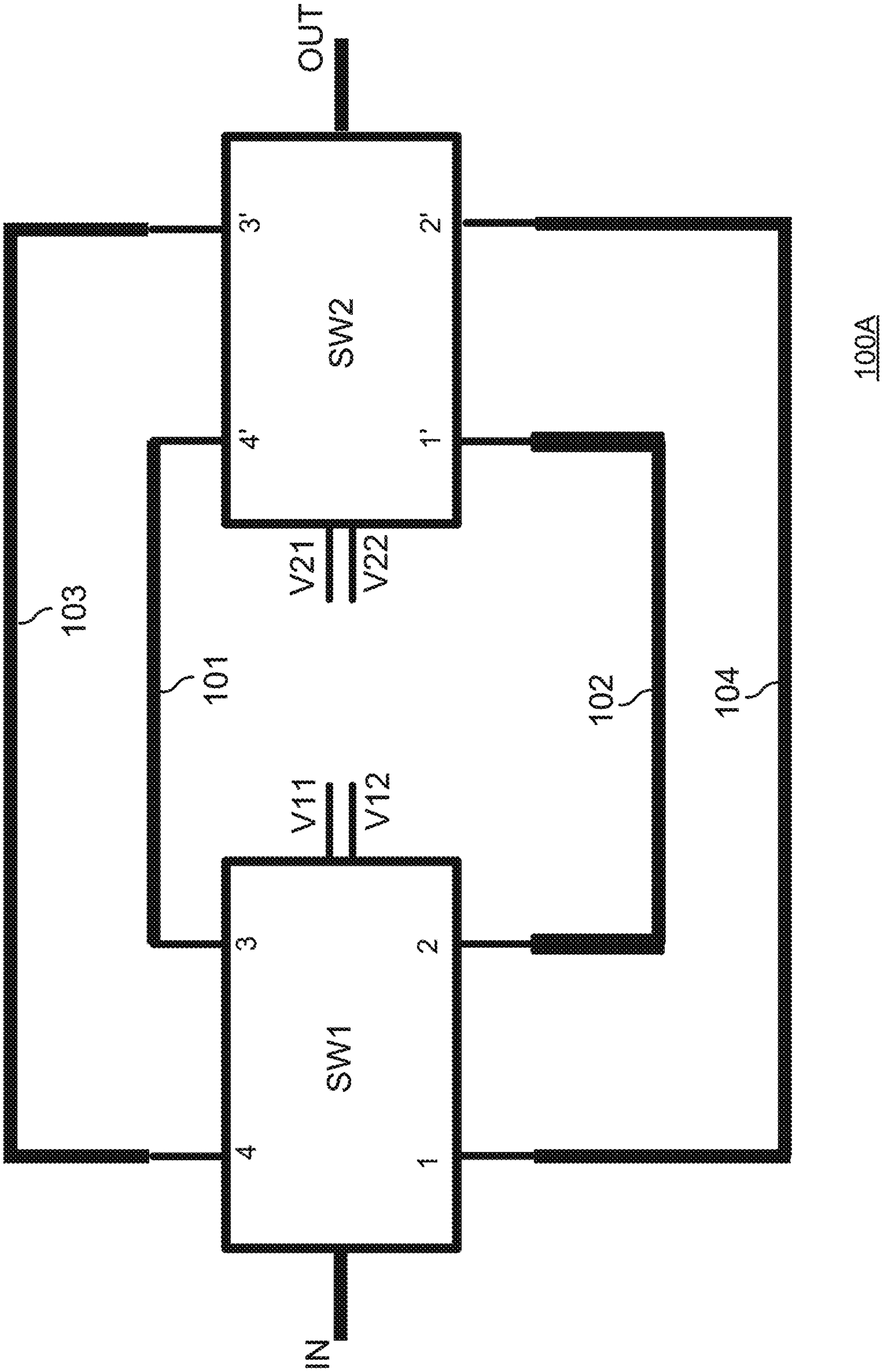
Fig. 1A (PRIOR ART)
FIG. 1A shows a prior art phase shifter.
Figure 1B:
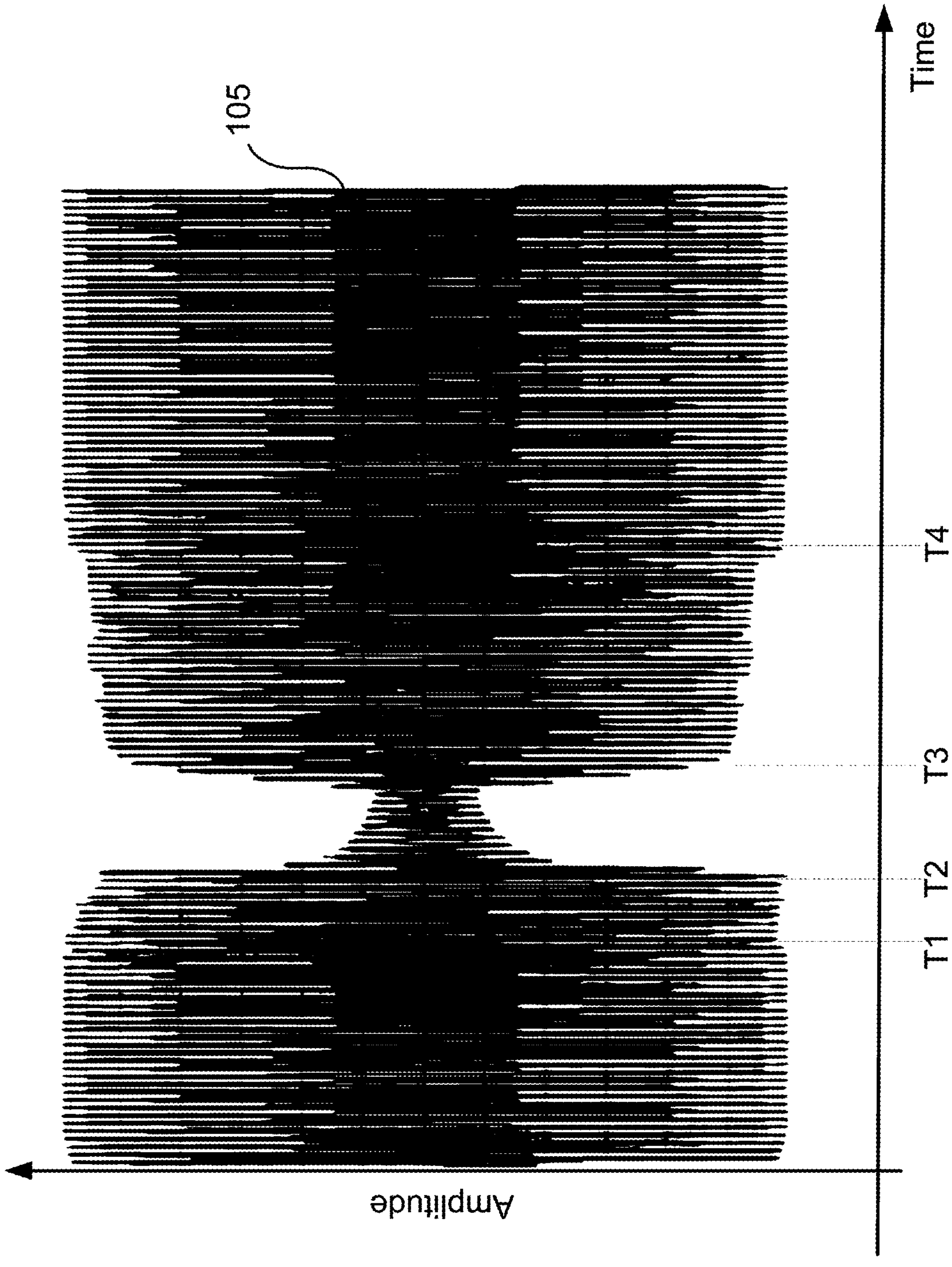
Fig. 1B (PRIOR ART)
FIG. 1B shows a prior art graph illustrating glitch issues.
Figure 1C:
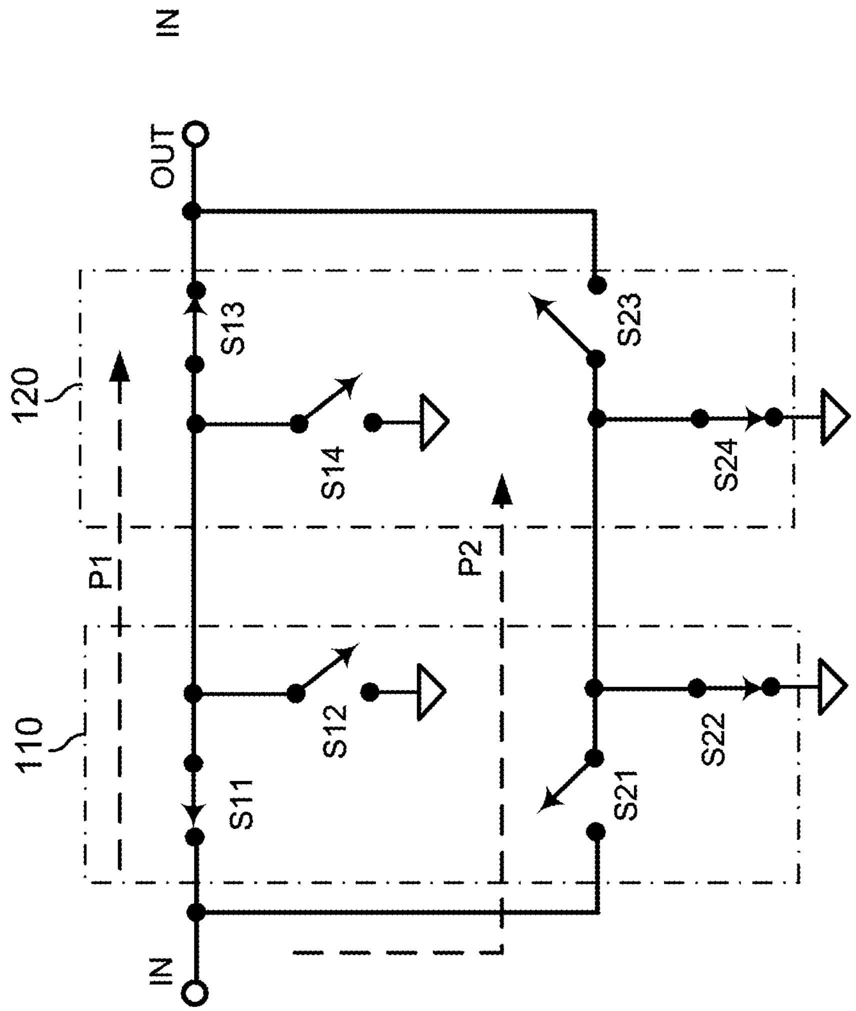
FIG. 1C shows a prior art phase shifter.
Figure 2B:
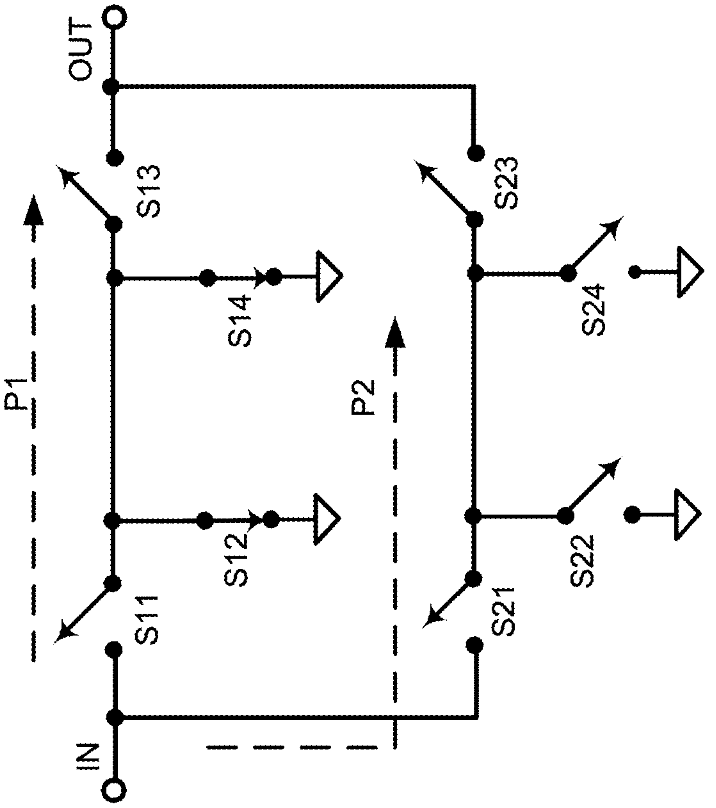
FIGS. 2A-2C show a first example of prior art steps to transition of a phase shifter from one phase shift to another.
Figure 2A:
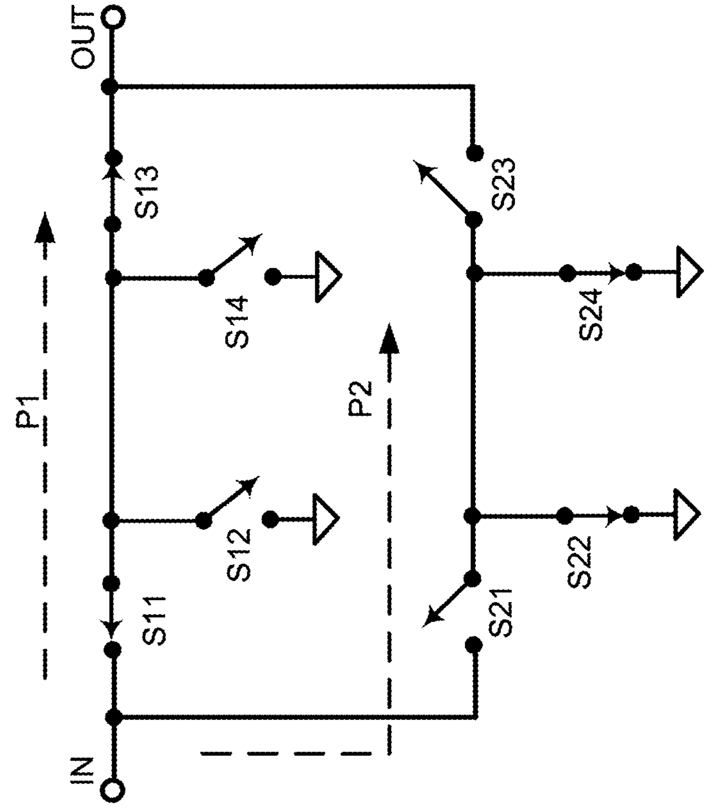
Figure 2C:
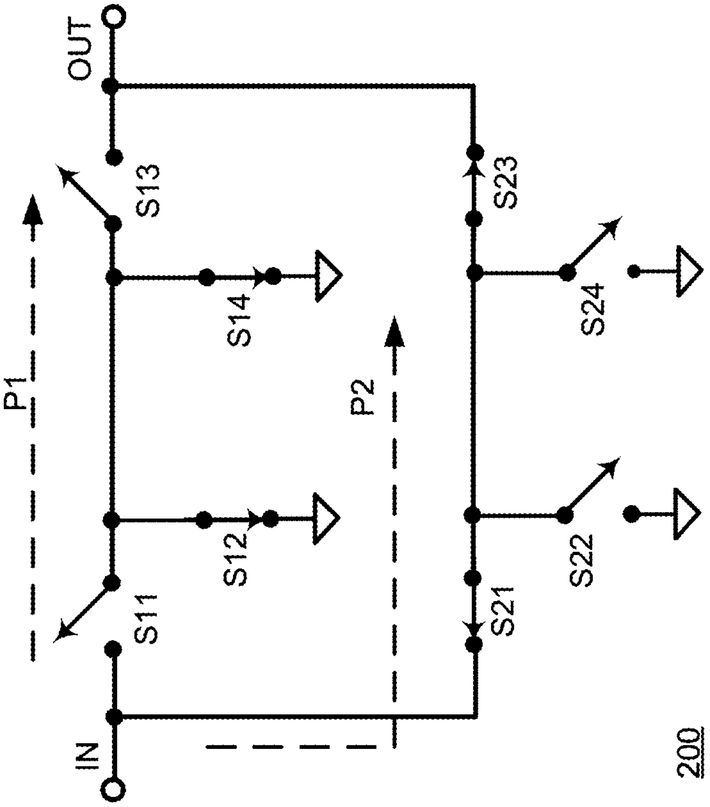
Figure 2E:
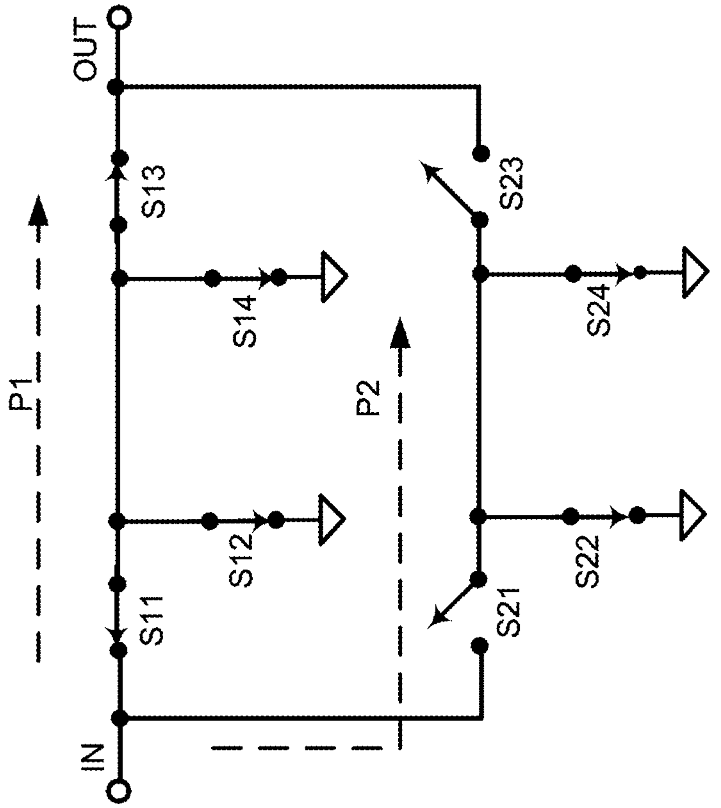
FIGS. 2D-2F show a second example of prior art steps to transition of phase shifter (200) from one phase shift to another.
Figure 2D:
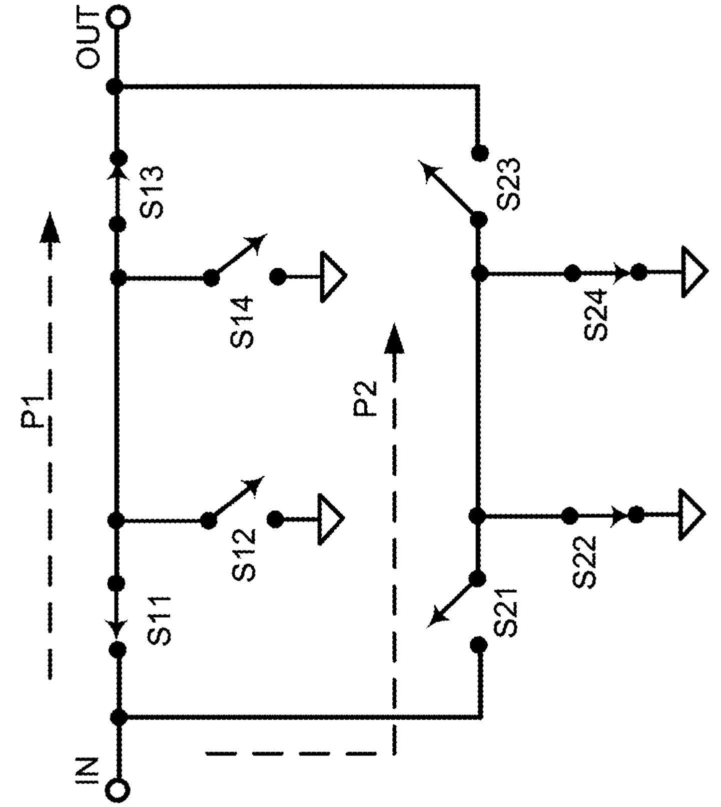
Figure 2F:
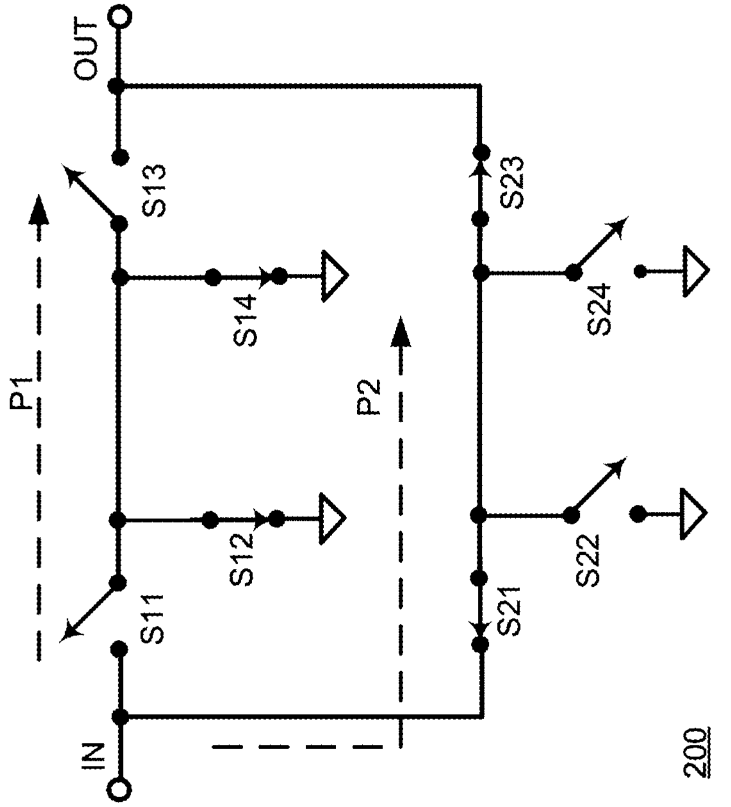
Figure 2H:
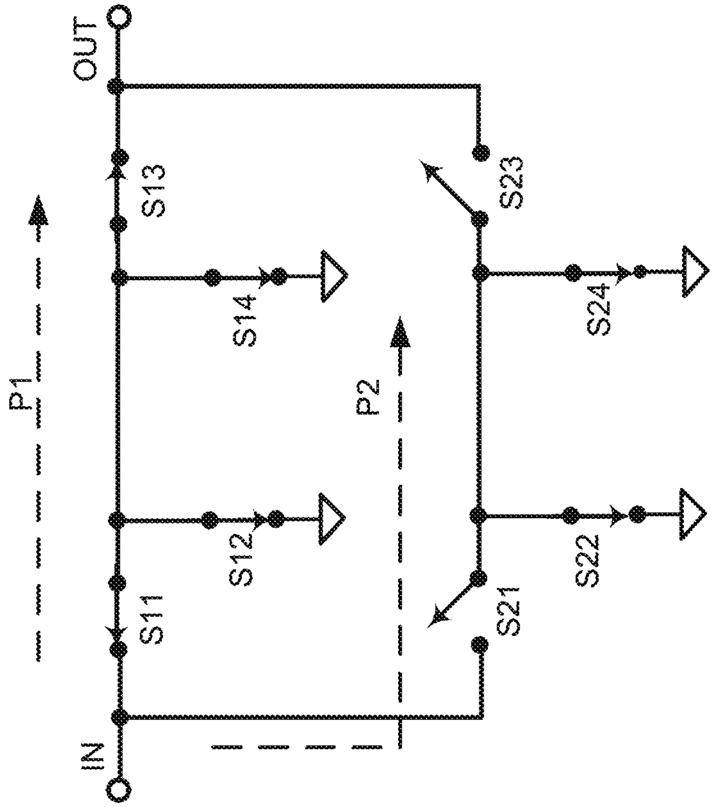
FIGS. 2G-2J show a first example of prior art steps to transition of phase shifter (200) from one phase shift to another.
Figure 2G:
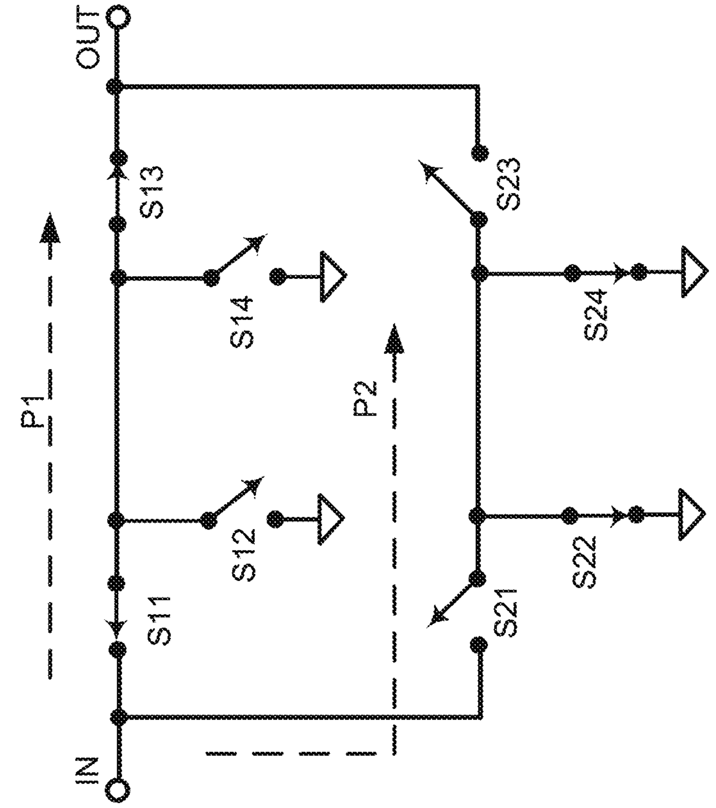
Figure 2J:
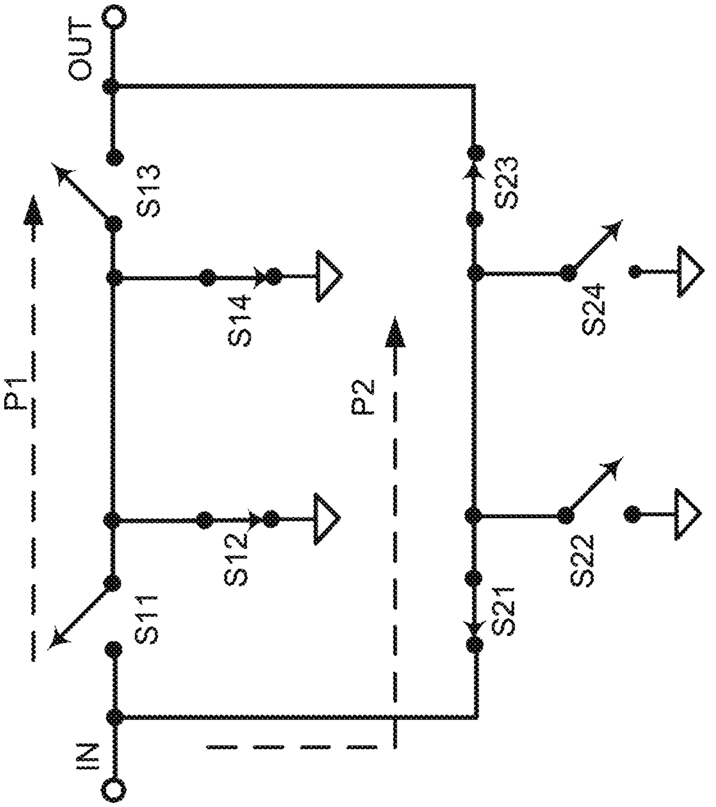
Figure 2I:
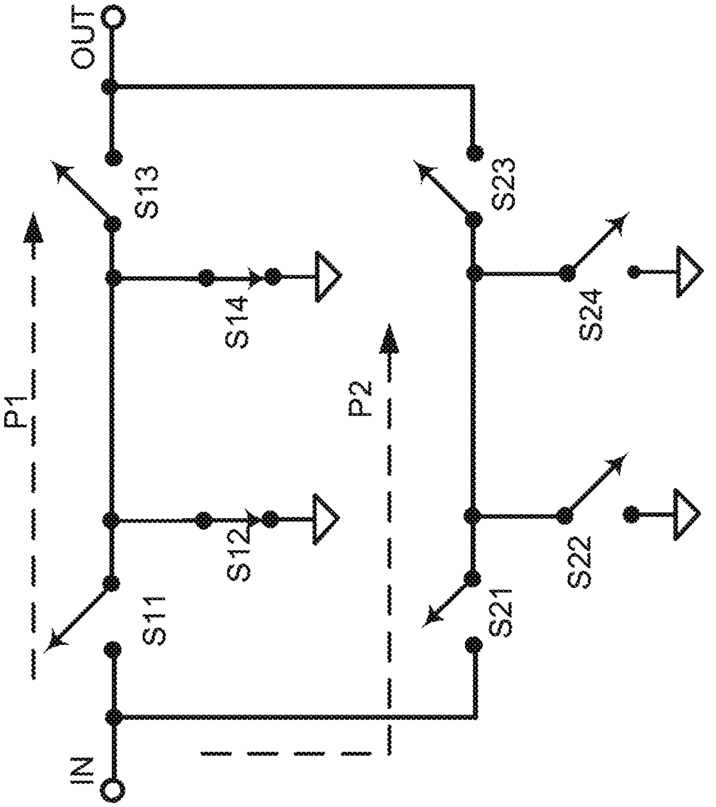

In order to demonstrate an exemplary implementation of how the state of the series and shunt switches are controlled when a phase shifter transition from one phase shift to another, in what follows, phase shifter (100C) of FIG. 1C is considered. As the functionalities of the sets of switches (110, 120) of FIG. 1C are similar, for the sake of clarity, only one of such sets and corresponding implementation and control will be described.

Figure 7:
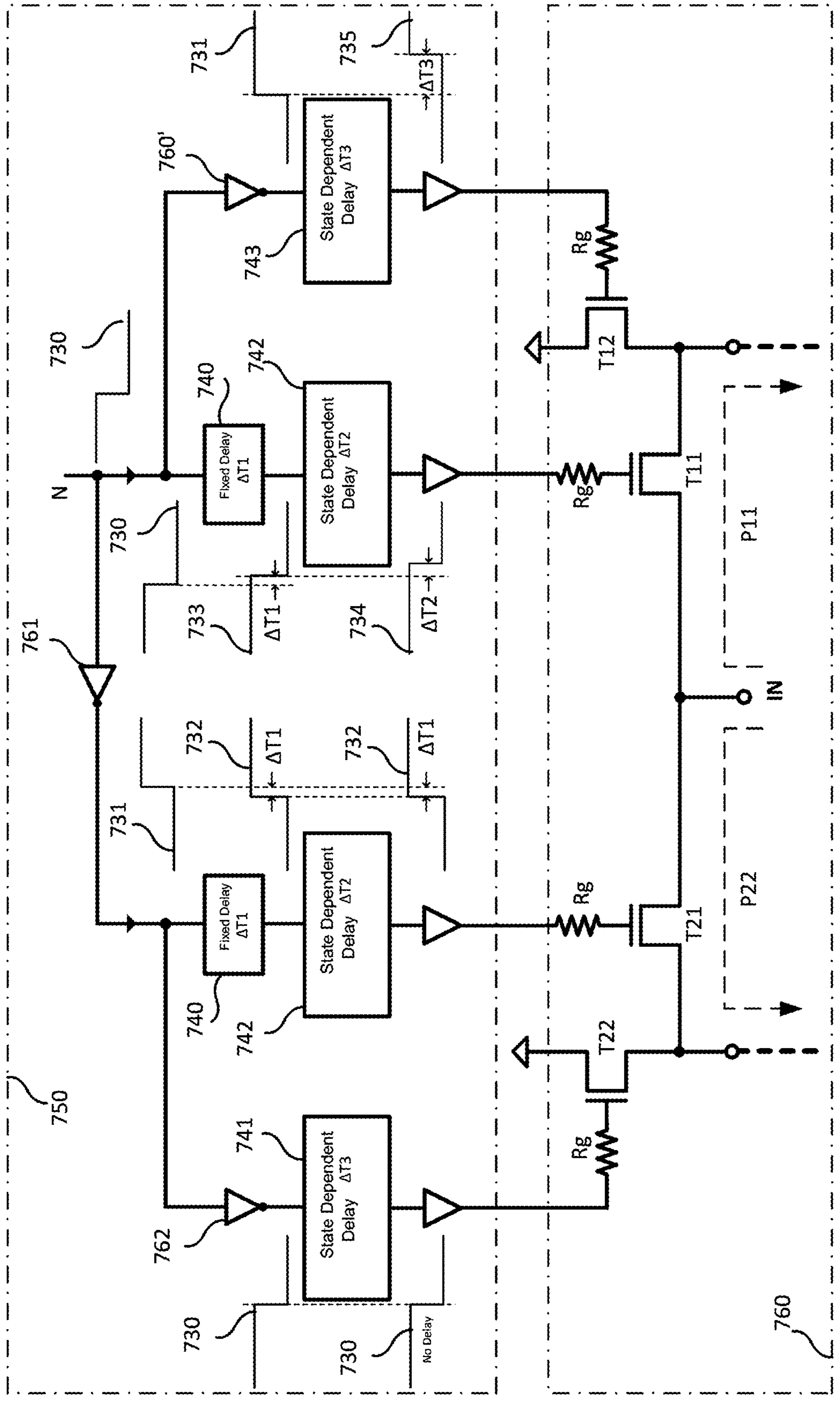
FIG. 7 shows an exemplary circuit implementing a phase shifter control method according to an embodiment of the present disclosure.

FIG. 7 shows an exemplary circuit (700) according to an embodiment of the present disclosure. Circuit (700) comprises a set of switches (760) and a control circuit (750). Set of switches (760) is an exemplary implementation of first set of switches (110) of FIG. 1C where transistors (T11, T12, T21, T22) represent basically the counterparts of switches (S11, S12, S21, S22) respectively. Moreover, paths (P11, P22) of FIG. 7 are analogous to paths (P1, P2) of FIG. 1C. Control circuit (750) comprises delay blocks (740, . . . , 743) and inverters (760', 761 762). Also shown are gate resistors (Rg), each being serially connected to the gate-terminals of a corresponding transistor.

With reference to FIG. 7, delay block (740) is a fixed-delay block, meaning that regardless of the type of the transition (logic level LOW to HIGH, or HIGH to LOW) of the input signal applied to the input of such delay block, such input signal will be passed to the output of the block after a delay of duration ($\Delta T_1$). On the other hand, delay blocks (741, 742, 743) are state-dependent delay blocks, meaning that such blocks will delay their input signal only when specific state transition (LOW to HIGH, or HIGH to LOW) occurs in the input signal. In an embodiment, delay blocks (741, 743) delay their input signal by delay of durations ($\Delta T_1$, $\Delta T_3$) respectively, and only when a transition from logic LOW to HIGH occurs at such input signal. A transition from logic level HIGH to LOW at the input of delay blocks (741, 743) will be passed to the delay block output without any delay. Delay block (742) delays its input signal by a delay of duration ($\Delta T_2$), and only when a transition from logic HIGH to LOW occurs in such input signal.

In what follows, the transition from path (P11) to path (P22) will be considered to demonstrate the functionality of control circuit (750). With further reference to FIG. 7, the main control signal (730) is applied to node (N) of control circuit (750). During a first step, where control signal (730) is at logic level HIGH, the bias voltages at the gate-terminals of through transistor (T11), and shunt transistor (T22) are positive and as a result, transistors (T11, T22) are ON. Moreover, the bias voltages present at the gate-terminals of shunt transistor (T12) and through transistor (T21) are zero or negative, sufficient to turn transistors (T12, T21) OFF. In other words, during the second step, path (P11) is active, coupling the input terminal (IN) to the output terminal (not shown in FIG. 7), and path (P22) is inactive. The transition from path (P11) to path (P22) is triggered by a falling edge of the control signal (730), in other words, when control signal (730) transitions from logic level HIGH to LOW. The transition from path (P11) to Path (P22) takes place through a sequence of four steps (second to fifth step), as detailed below:

Second Step

As shown in FIG. 7, the transition of control signal (730) from logic HIGH to LOW is passed through delay block (741) without any delay, as delay block (741) is a LOW to HIGH transition delay block. As such, the bias voltage at the gate-terminal of transistors (T22) turns LOW and as a result, shunt transistor (T22) is turned OFF. Transistors (T21, T11, T12) do not experience any immediate change of state during the first step. The duration of the first step is $\Delta T_1$. The person skilled in the art will understand that a HIGH represents typically a positive voltage and a LOW is either zero or negative to turn the desired transistors OFF.

Third Step

At time instant $\Delta T_1'$, as indicated by control signal (732), each the outputs of delay blocks (740, 742) will experience a transition from logic LOW to HIGH, and as a result, the bias voltage present at the gate terminal of transistor (T21) turns positive. As such transistor (T21) will be turned ON. The duration of the second step is $\Delta T_2'$. During the second step, control signal (732) passes through delay block (742) without any additional delay, because such delay block is a HIGH to LOW transition delay block.

Fourth Step

At time instant $\Delta T_1'+\Delta T_2'$, as indicated by control signal (734), the bias voltage at the gate-terminal of transistor (T11) will transition from a positive to a negative voltage, and as a result, transistor (T11) will turn OFF. The states of the other transistors are not impacted in this step. The duration of the third step is $\Delta T_3'$.

Fifth Step

At time instant $\Delta T_3$, as indicated by control signal (735), the bias voltage at the gate-terminal of shunt transistor (T12)

will transition from a negative voltage to a positive voltage to turn transistor (T12) ON. At this stage, the transition from path (P11) to path (P22) has taken place. In a preferred embodiment, $\Delta T_1'+\Delta T_2'<\Delta T_3'$.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A phase shifter comprising:

a) a first terminal and a second terminal b) a plurality of selectively switchable phase shifting paths connected between the first terminal and the second terminal;

c) a control circuit configured to control switching of the plurality of phase shifting paths such that:

in a given transition from a first phase shifting path to a second phase shifting path, an intermediary phase shifting path between the first and second phase shifting paths is activated to couple the first terminal to the second terminal via the intermediary phase shifting path before activating the second phase shifting path, wherein i) the intermediary phase shifting path is activated by decoupling its ends from ground, and coupling its ends to the first and second terminals;

ii) then, the first phase shifting path is deactivated by decoupling its ends from the first and second terminals and coupling its ends to ground.

2. The phase shifter of claim 1, wherein the plurality of selectively switchable phase shifting paths are connected in an ordered sequence of incremental phase shifts.

3. The phase shifter of claim 1, wherein the control circuit includes delay blocks configured to introduce state-dependent delays in switching transitions.

4. The phase shifter of claim 1, wherein each phase shifting path includes a series switch a combination of a series switch and a shunt switch.

5. The phase shifter of claim 4, wherein the control circuit controls the series and shunt switches through gate resistors.

6. The phase shifter of claim 4, wherein the series switches include field-effect transistors.

7. The phase shifter of claim 1, wherein a switching sequence from a first to a second phase shifting path proceeds recursively through at least two intermediary phase shifting paths.

8. The phase shifter of claim 1, wherein each intermediary phase shifting path activation introduces a delay to reduce signal cancellation.

9. The phase shifter of claim 8, wherein the delay blocks are configured to implement different delay durations for transitions from LOW to HIGH and HIGH to LOW logic states.

10. The phase shifter of claim 1, wherein the intermediary phase shifting path comprises a transmission line, capacitors or inductors.

11. An attenuator comprising:

a first terminal and a second terminal;

a plurality of selectively switchable attenuating paths;

a control circuit configured to control switching of the plurality of attenuating paths such that:

during a transition from a first attenuating path to a second attenuating path, an intermediary attenuating path is activated between the first and second attenuating paths by decoupling its ends from ground; coupling its ends to the first and second terminals;

then, the first attenuating path is deactivated by decoupling its ends from the first and second terminals; and coupling its ends to ground.

12. The attenuator of claim 11, wherein the plurality of selectively switchable attenuating paths correspond to discrete attenuation values arranged in incremental order.

13. The attenuator of claim 11, wherein the control circuit includes delay blocks configured to provide step-wise delay in switching transitions.

14. The attenuator of claim 11, wherein the selectively switchable attenuating paths comprise series switches or a combination of series switches and shunt switches.

15. The attenuator of claim 14, wherein the series and shunt switches are controlled via gate resistors.

16. The attenuator of claim 14, wherein the series or shunt switches include field-effect transistors.

17. The attenuator of claim 11, wherein each attenuating path comprises a transmission line segment.

18. A method of transitioning from a first phase shift to a second phase shift in a phase shifter, the method comprising:

activating an intermediary phase shifting path by decoupling ends of the intermediary phase shifting path from ground;

coupling the ends of the intermediary phase shifting path to a first terminal and a second terminal;

deactivating the first phase shifting path by decoupling its ends from the first and second terminals and coupling its ends to ground;

wherein the intermediary phase shifting path is selected between the first and second phase shifting paths in a recursive sequence to minimize signal cancellation and glitch amplitude.

19. The method of claim 18, wherein the intermediary phase shifting path corresponds to a path with a phase shift incrementally between the first and second phase shifting paths.

20. The method of claim 18, wherein the method is performed by a control circuit comprising fixed-delay and state-dependent delay blocks.

* * * * *